United States Patent
Hwang et al.

(10) Patent No.: US 6,268,266 B1
(45) Date of Patent: Jul. 31, 2001

(54) METHOD FOR FORMING ENHANCED FOX REGION OF LOW VOLTAGE DEVICE IN HIGH VOLTAGE PROCESS

(75) Inventors: Ching-Chun Hwang, Taichung; Fei-Hung Chen, Chu-Pei; Meng-Jin Tsai, Kaohsiung; Wei-Chung Chen, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/425,600

(22) Filed: Oct. 22, 1999

(51) Int. Cl.[7] ........................................... H01L 21/76
(52) U.S. Cl. .................. 438/439; 438/440; 438/443; 438/449; 438/450; 438/451
(58) Field of Search ................. 438/439, 440, 438/443, 449, 450, 451

(56) References Cited

U.S. PATENT DOCUMENTS

| | | | |
|---|---|---|---|
| 4,748,134 | * | 5/1988 | Holland et al. ................. 438/440 |
| 4,764,248 | * | 8/1988 | Bhattacherjee et al. ............ 156/643 |
| 4,952,525 | * | 8/1990 | Van Der Plas ................. 438/443 |
| 5,344,787 | * | 9/1994 | Nagalingam et al. ............... 438/298 |
| 5,413,953 | * | 5/1995 | Chien et al. .......................... 438/443 |
| 5,904,575 | * | 5/1999 | Ishida et al. .......................... 438/770 |
| 5,937,310 | * | 8/1999 | Gardner et al. ....................... 438/440 |
| 5,942,780 | * | 8/1999 | Barsan et al. ......................... 257/321 |
| 5,962,914 | * | 10/1999 | Gardner et al. ....................... 257/607 |
| 6,022,768 | * | 2/2000 | Peidous ................................. 438/197 |
| 6,037,639 | * | 3/2000 | Ahmad ................................. 257/401 |
| 6,054,368 | * | 4/2000 | Yoo et al. ............................. 438/450 |
| 6,069,054 | * | 5/2000 | Choi ..................................... 438/423 |
| 6,121,116 | * | 9/2000 | Sung .................................... 438/452 |
| 6,127,242 | * | 10/2000 | Batra et al. ........................... 438/440 |

\* cited by examiner

Primary Examiner—John F. Niebling
Assistant Examiner—Lynne A. Gurley

(57) ABSTRACT

A method for forming enhanced field oxide (FOX) region of low voltage devices in a high voltage process is disclosed. The method includes providing a semiconductor structure comprising a substrate, two field oxide regions on the substrate, a well between the two field oxide regions in the substrate and a silicon nitride layer between the two field oxide regions above the well. As a key step, nitrogen is implanted into the semiconductor structure, and the silicon nitride layer is then removed. Then, a gate oxide layer on the well and silicon oxynitride layer on the field oxide regions are all formed in-situ.

14 Claims, 6 Drawing Sheets ically, the element structure has been minimized. On the other hand, the on-chip system, which involves the combination of minimized semiconductor elements and systems for operating the semiconductor elements built on one chip, has been popular. In the case of on-chip semiconductor devices, low voltage elements with low voltage and high voltage elements with high voltage are formed on the same semiconductor substrate to accomplish minimization.

METHOD FOR FORMING ENHANCED FOX REGION OF LOW VOLTAGE DEVICE IN HIGH VOLTAGE PROCESS

BACKGROUND OF THE INVENTION

1. Field of the Invention

The present invention generally relates to a method for forming a semiconductor isolation device, and more particularly to a method for forming an enhanced field oxide region of a low voltage device in a high voltage process.

2. Description of the Prior Art

As the semiconductor device has been progressively densely integrated, the element structure has been minimized. On the other hand, the on-chip system, which involves the combination of minimized semiconductor elements and systems for operating the semiconductor elements built on one chip, has been popular. In the case of on-chip semiconductor devices, low voltage elements with low voltage and high voltage elements with high voltage are formed on the same semiconductor substrate to accomplish minimization.

Isolation is provided in a semiconductor between transistors on a semiconductor chip to prevent unwanted electrical connections therebetween.

The conventional isolation device is FOX (field oxide) whose formulation is forming a silicon nitride layer defined on active areas and forming a FOX region between the active areas using a suitable thermal oxidation method. FIGS. 1A to 1C are schematic representations of structures at various stages during the formulation of a low voltage device and a high voltage device in a chip using conventional, prior art techniques. One portion denotes a low voltage device while the other portion denotes a high voltage device in all of the figures. First, a substrate 100 is provided with wells 110, 112 formed therein. Wells 110, 112 are formed in the substrate 100 by a suitable implantation method. A silicon nitride layer 140 is then formed on the substrate 100 and is defined on the active areas. Then, field oxide regions 120 are formed using a conventional thermal oxidation method between the active areas. It is obvious that the silicon nitride layer 140 is the mask of forming field oxide region 120.

Referring to FIG. 1B, the silicon nitride layer 140 is removed both on the low voltage device and the high voltage device. Then, a thick gate oxide layer 122 is formed on the active areas using a suitable thermal oxidation method. The thickness of this oxide layer 122 is provided for high voltage device while the gate oxide layer of the low voltage device is formed by etching. Then, the gate oxide layer of the low voltage device will be etched to a thin gate oxide layer 124 (depending on the voltage level) while all high voltage devices are masked by a photoresist layer 150, as shown in FIG. 1C. However, the field oxide regions 120 in low voltage device will be etched in-situ to cause the field oxide region loss when etching the gate oxide 122. This will decrease the isolation in low voltage device.

A direct way of overcoming this problem is to increase the thickness of the field oxide region when forming the gate oxide layer 122. However, there is no way to grow an oxide layer on the field oxide region. Another method to solve this issue is to increase the thickness of the field oxide region. Nevertheless, the increased thickness of the field oxide region will cause the active area due to the bird's beak to increase the design rule of one chip.

SUMMARY OF THE INVENTION

In accordance with the present invention, a method is provided for forming an enhanced field oxide region of a low voltage device in a high voltage process that substantially prevents the FOX region from being etched when etching the gate oxide layer. This method essentially utilizes two key steps. These steps include nitrogen implantation before removing silicon nitride first and then transferring silicon nitride to silicon oxynitride on the field oxide region by the temperature of forming the gate oxide layer. Because the etching rate of silicon oxynitride is lower than that for silicon oxide, there is no field oxide loss when etching a gate oxide of a low voltage device. This method will possess the pretty isolation of a field oxide under the same design rule.

It is another object of this invention that the increased number of steps of this process is compatible with the formation of an enhanced FOX region.

In one embodiment, a method for forming an enhanced field oxide region of low voltage device in a high voltage process is disclosed. The method comprises providing a substrate and then forming at least one well in the substrate. Then, a field oxide region is formed on the substrate between the well. As a key step, nitrogen is tilt implanted into the field oxide region, and the silicon nitride layer is then removed. Gate oxide layer on the well and a silicon oxynitride layer on the field oxide regions are formed in-situ by thermal oxidation method. Then, a mask layer is formed on the high voltage device, and the gate oxide layer of the low voltage device is etched.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
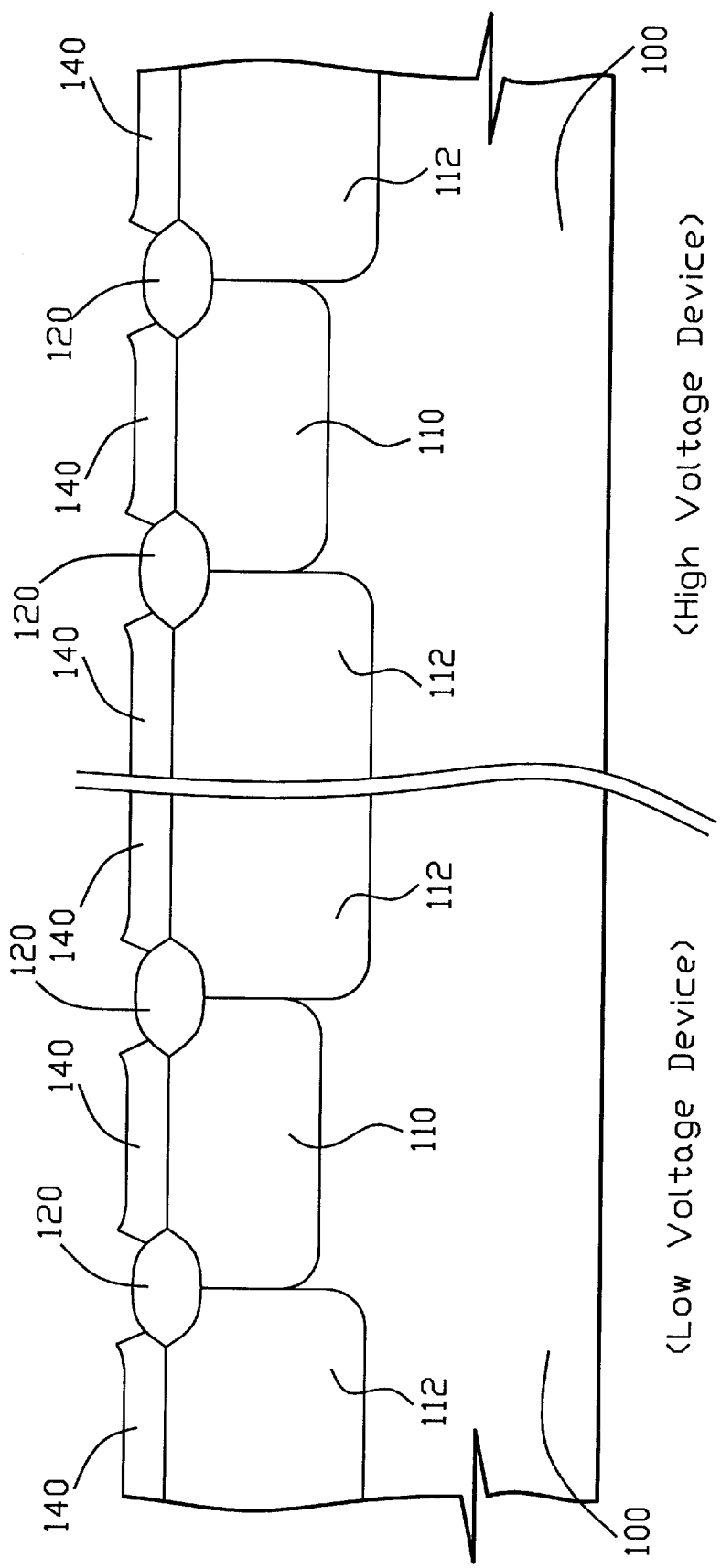
FIGS. 1A to 1C are schematic representations of structures at various stages during the formulation of a enhanced field oxide of a low voltage device in a high voltage process in accordance with a method disclosed.
Figure 1B:
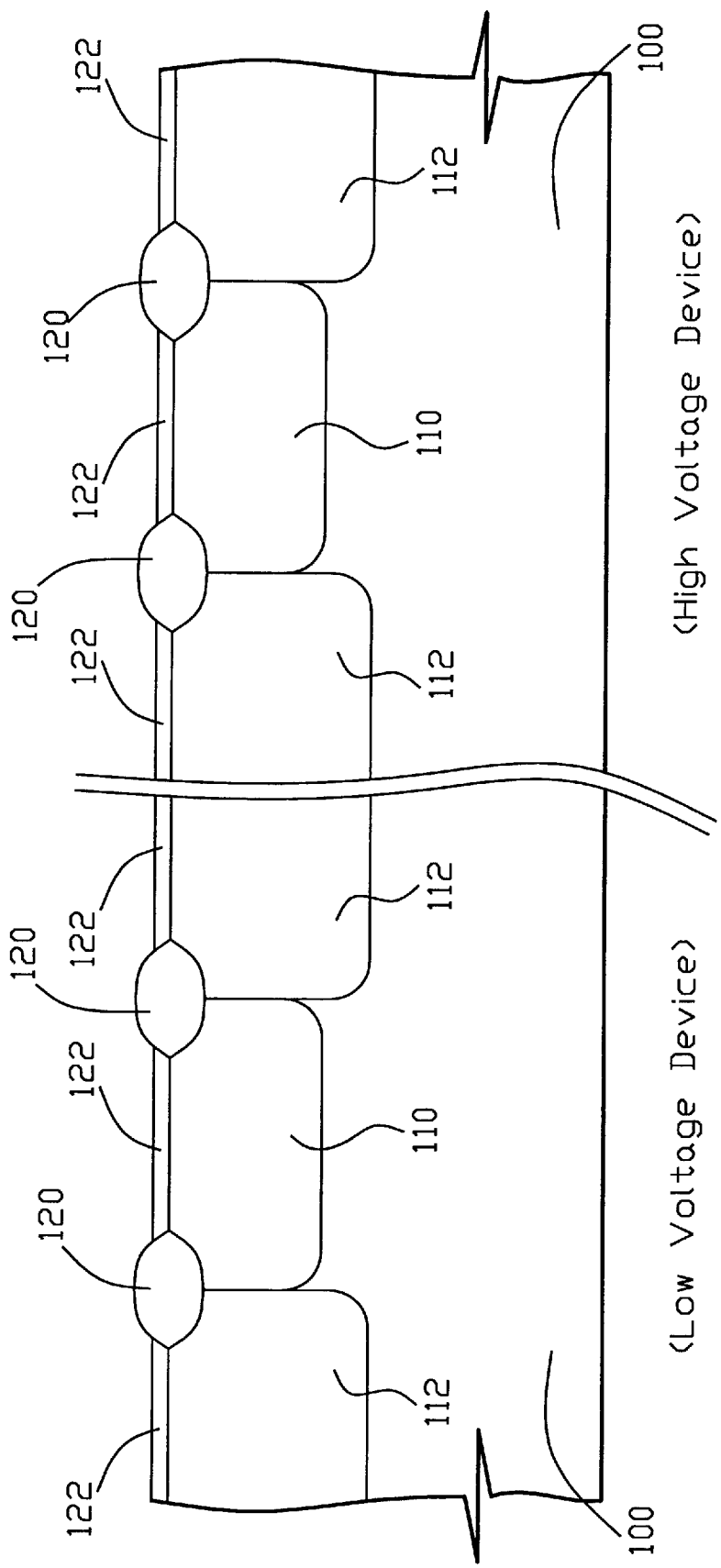
Figure 1C:
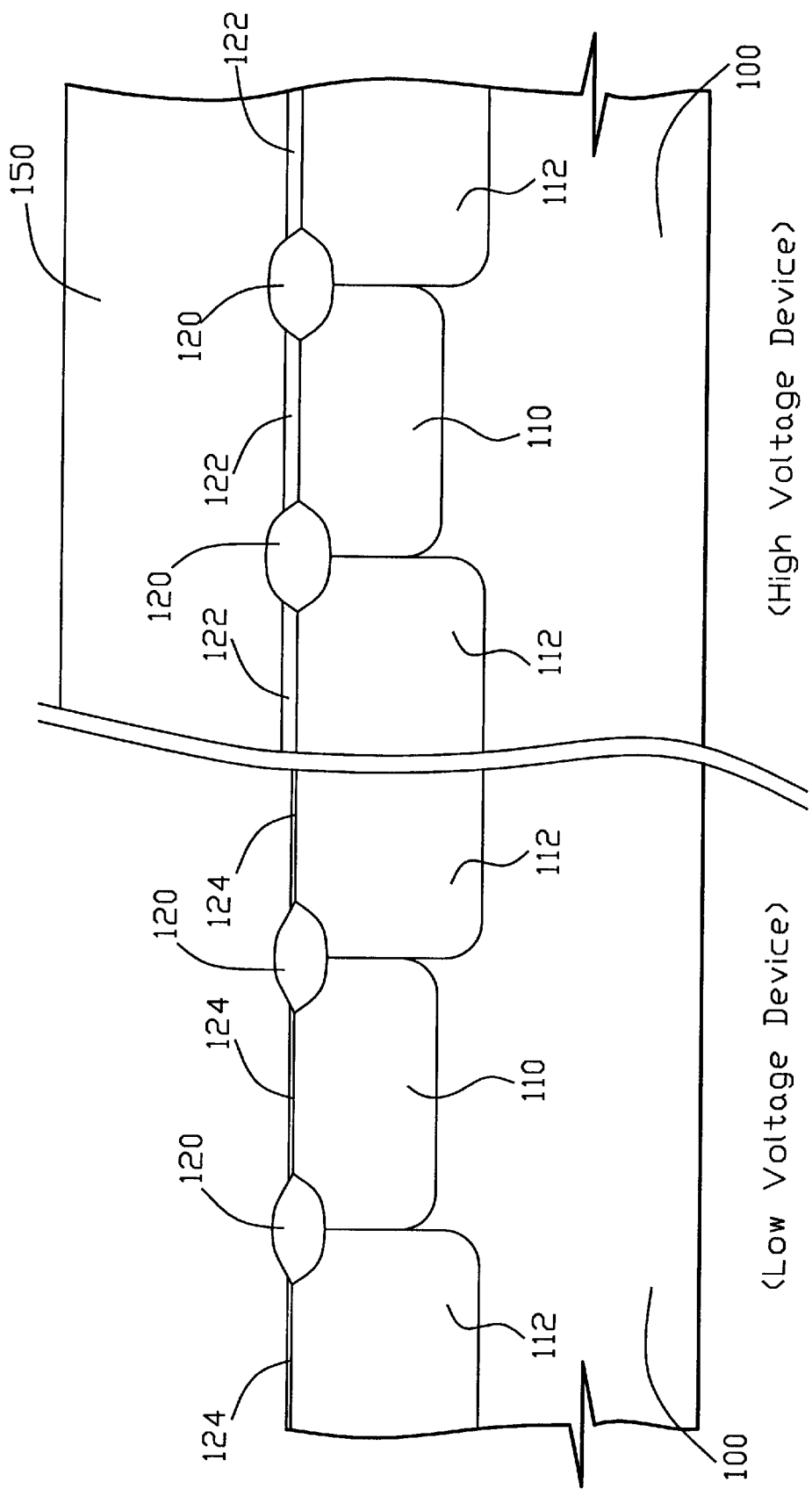

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide a duality of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

This invention utilizes nitrogen implantation before removing silicon nitride layer for forming FOX. Then, a silicon oxynitride layer is formed on the FOX with formulation of gate oxide layer. Because the etching rate of silicon oxynitride is lower than silicon oxide, there is no field oxide loss when etching the gate oxide of a low voltage device.

Referring to FIG. 1A, a substrate 10 is provided again with wells 11 and 12 formed therein. Wells 11, 12 are formed in the substrate 10 by any conventional implantation method. The type of this substrate 10 may be P-type and the wells may be N-type or another P-type. Both the low voltage device and high voltage device are on the same substrate 10. The surface of these wells includes active areas and is masked by a silicon nitride layer 40. This silicon nitride layer 40 formed by any conventional method, such as LPCVD (low pressure chemical vapor deposition), is a portion of LOCOS (local oxidation of silicon) process. Then, FOX 20 is formed using any conventional method between active areas on the substrate 10 unmasked by the silicon nitride layer 40. It is obvious that silicon nitride layer 140 is the mask for forming the field oxide region 120.

As a key step in this invention, a nitrogen implantation 60 is performed on the chip such that a region 30 on the FOX 20 is doped with nitrogen. It is better that the implantation 60 is tilt implanted due to the fact that nitrogen can be doped into FOX 20 more deeply and uniformly. The implantation symbol 60 in FIG. 1A represents such a tilt implantation. In this embodiment, the dose of the nitrogen implantation is between about $5E13/cm^2$ to $5E15/cm^2$, and the energy is between about 30 Kev to 80 Kev. The tilt degree is between about 10 to 30 degrees depending on applied voltage. After nitrogen tilt implantation, silicon nitride layer 40 will be removed.

Figure 2A:
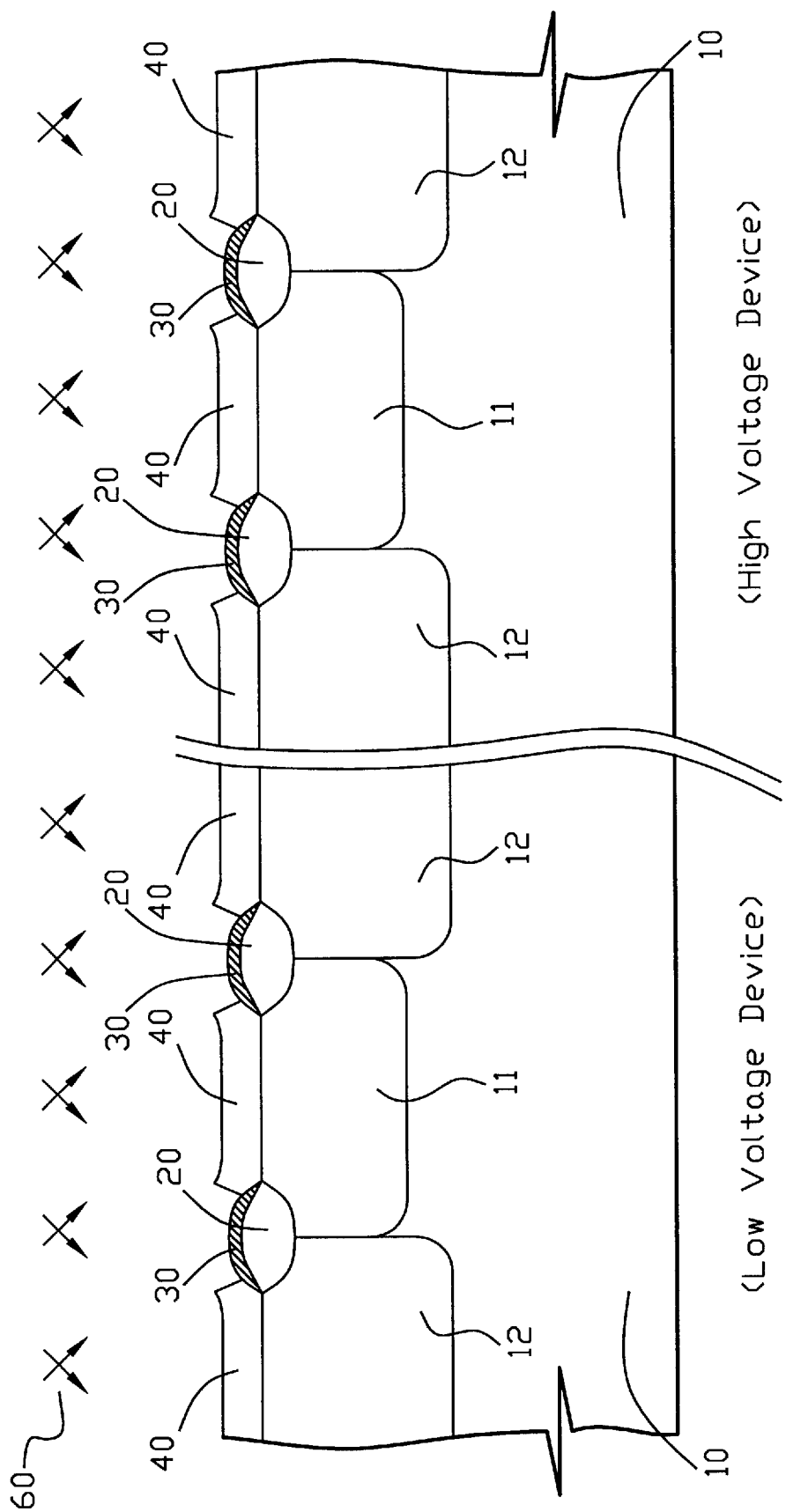
FIG. 2A to 2C are schematic representations of structures at various stages during the formulation of an enhanced field oxide of a low voltage device in a high voltage process in accordance with a method disclosed.
Figure 2B:
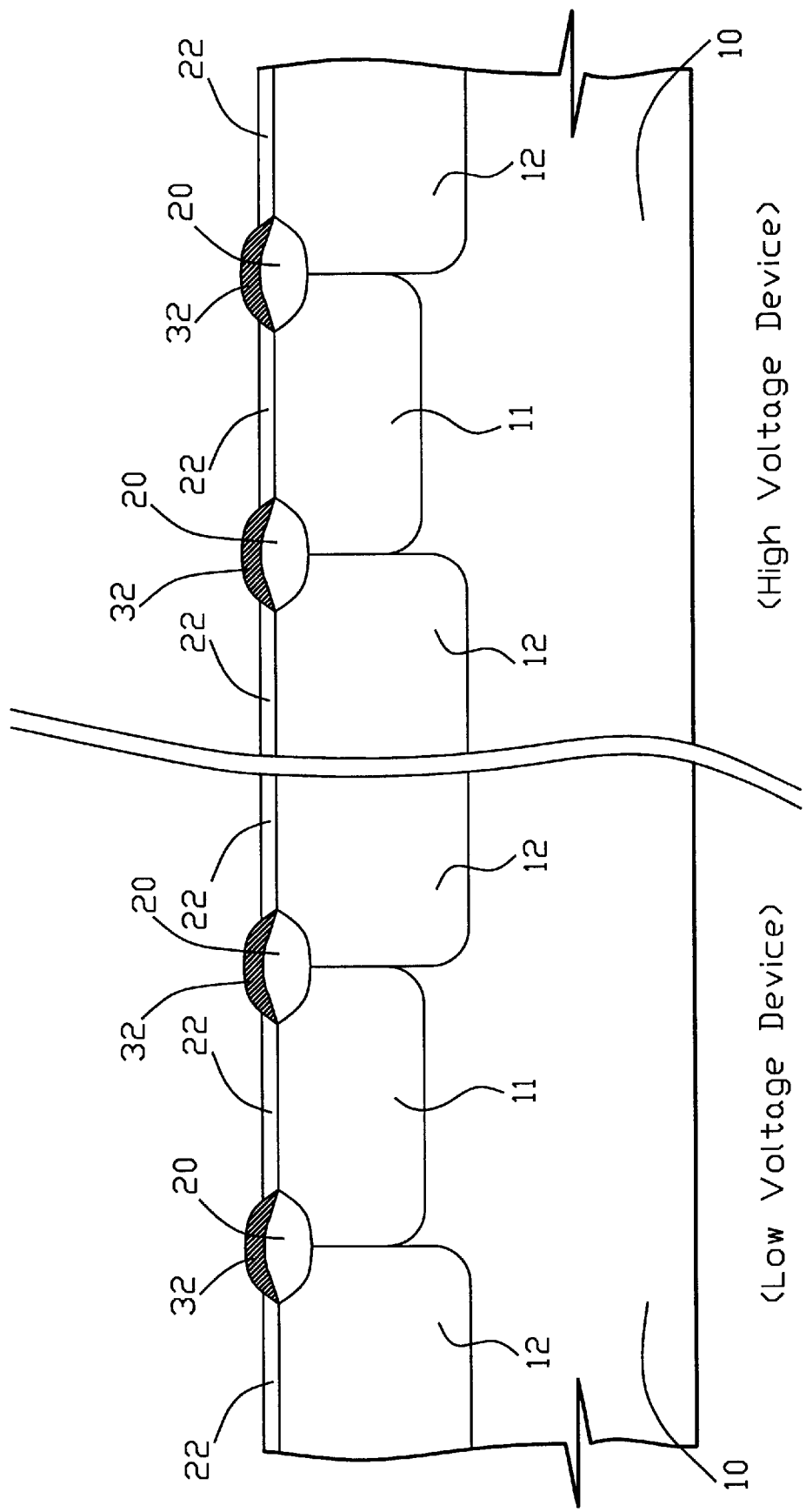

Referring to FIG. 2B, a blanket gate oxide layer 22 is formed on the substrate 10 by using any conventional thermal oxidation method. The thickness of this gate oxide layer 22 between about 300 to 1000 angstroms and is for the high voltage device. The thickness of the gate oxide layer depends on the applied voltage level. When the gate oxide layer 22 is formed, a silicon oxynitride layer 32 is formed in-situ for the same thermal oxidation method.

Figure 2C:
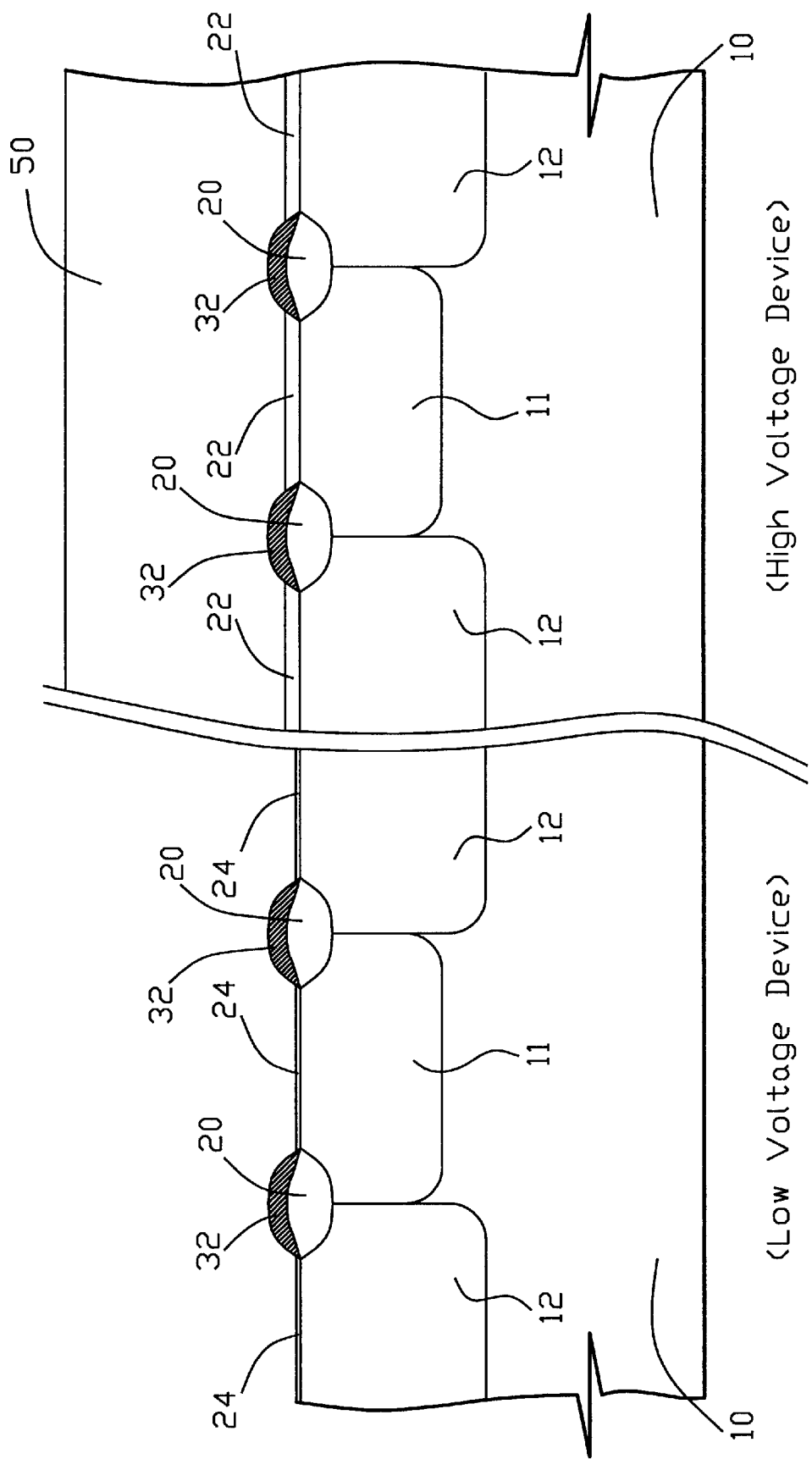

The subsequent process is to etch the gate oxide layer 22 in a low voltage device. Referring to FIG. 2C, a mask 50 is formed on the high voltage device area. In this embodiment, a photoresist layer is preferred for convenience. Then, a photoresist layer 50 is formed using any conventional spin coating method and then is patterned by photolithography. Then, a suitable oxide etching is performed to etch the gate oxide layer 22 to a thickness of about 0 angstrom, the etched thickness depends on applied voltage and is between about 300 to 1000 angstroms in low voltage device. Due to the preferred etch method such as DHF or DRM, the gate oxide layer 22 will be etched to a thin gate oxide layer 24 in the low voltage device while no FOX loss occurs. FOX comprising silicon oxide 20 and silicon oxynitride 32 still possesses good isolation.

Although specific embodiments have been illustrated and described, it will be obvious to those skilled in the art that various modifications may be made without departing from what is intended to be limited solely by the appended claims.

What is claimed is:

1. A method for forming enhanced isolation regions in a semiconductor device, said method comprising:

providing a semiconductor structure comprising a substrate, two field oxide regions on said substrate, a well between said two field oxide regions in said substrate and a silicon nitride layer between said two field oxide regions above said well;

implanting Nitrogen into said semiconductor structure;

removing said silicon nitride layer; and forming a gate oxide layer on said well, wherein the nitrogen in said field oxide regions is transformed into a silicon oxynitride layer while forming the gate oxide.

2. The method according to claim 1, wherein said nitrogen implantation is tilt implantation.

3. The method according to claim 1, wherein said gate oxide layer is formed by thermal oxidation method.

4. The method according to claim 1, wherein said silicon oxynitride layer of said field oxide region is formed by thermal oxidation method.

5. The method according to claim 1, wherein said semiconductor device comprises a low voltage device and a high voltage device.

6. The method according to claim 5, further comprising:

forming a mask layer on said high voltage device; and etching a partial thickness of said gate oxide layer of said low voltage device, whereby no oxide loss in said field oxide regions occurs due to the protection of said silicon oxynitride layer thereon.

7. A method for forming enhanced field oxide region of a semiconductor circuit, said field oxide region being located in a low voltage device of said semiconductor circuit, said method comprising:

providing a semiconductor structure comprising a substrate, two field oxide regions on said substrate, a well between said two field oxide regions in said substrate and a silicon nitride layer between said two field oxide regions above said well;

tilt implanting Nitrogen into said semiconductor structure;

removing said silicon nitride layer; and forming a gate oxide layer on said well, wherein the nitrogen in said field oxide regions is transformed into a silicon oxynitride layer while forming the gate oxide.

8. The method according to claim 7, wherein said gate oxide layer is formed by thermal oxidation method.

9. The method according to claim 7, wherein said silicon oxynitride layer of said field oxide region is formed by thermal oxidation method.

10. The method according to claim 7, wherein said semiconductor device comprises a high voltage device area.

11. The method according to claim 10, further comprising:

forming a mask layer over said high voltage device area; and etching a partial thickness of said gate oxide layer of said low voltage device, whereby no oxide loss in said field oxide regions occurs due to the protection of said silicon oxynitride layer thereon.

12. A method for forming enhanced field oxide region of low voltage device in high voltage process, said method comprising:

providing a substrate on which low voltage device area and high voltage device area are defined;

forming at least one well in said substrate;

forming a silicon nitride layer on said well;

forming two field oxide regions on said substrate so that the well is located between said two field oxide regions;

tilt implanting nitrogen into said field oxide region;

removing said silicon nitride layer;

forming a gate oxide layer on said well, wherein the nitrogen in said field oxide regions is transformed into a silicon oxynitride layer while forming the gate oxide;

forming a mask layer over said high voltage device area; and etching a partial thickness of said gate oxide layer of said low voltage device, whereby no oxide loss in said field oxide regions occurs due to the protection of said silicon oxynitride layer thereon.

13. The method according to claim 12, wherein said gate oxide layer is formed by thermal oxidation method.

14. The method according to claim 12, wherein said silicon oxynitride layer of said field oxide region is formed by thermal oxidation method.

* * * * *

UNITED STATES PATENT AND TRADEMARK OFFICE
CERTIFICATE OF CORRECTION

PATENT NO.    : 6,268,266 B1
DATED         : July 31, 2001
INVENTOR(S)   : David Angell et al.

It is certified that error appears in the above-identified patent and that said Letters Patent is hereby corrected as shown below:

<u>Title page,</u>
Item [56], References Cited, OTHER PUBLICATIONS, delete "Least-Squeares" and insert -- Least-Squares --;

<u>Column 8,</u>
Line 3, delete "11" and insert -- 1 --.

Signed and Sealed this

Twenty-eighth Day of May, 2002

Attest:

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO.   : 6,268,266 B1
DATED        : July 31, 2001
INVENTOR(S)  : Ching-Chun Hwang et al.

It is certified that error appears in the above-identified patent and that said Letters Patent is hereby corrected as shown below:

This certificate supersedes Certificate of Correction issued May 28, 2002, the number was erroneously mentioned and should be vacated since no Certificate of Correction was granted.

Signed and Sealed this

Tenth Day of December, 2002

JAMES E. ROGAN
*Director of the United States Patent and Trademark Office*